US012061057B2

(12) United States Patent
Nishikawa et al.

(10) Patent No.: US 12,061,057 B2
(45) Date of Patent: Aug. 13, 2024

(54) HEAT DISSIPATION MEMBER INCLUDING FIN GROUPS

(71) Applicants:Nidec Corporation, Kyoto (JP); Nidec Chaun-Choung Technology Corporation, New Taipei (TW)

(72) Inventors: Kazuhiro Nishikawa, Kyoto (JP); Yi-Huan Kao, New Taipei (TW)

(73) Assignees: NIDEC CORPORATION, Kyoto (JP); NIDEC CHAUN-CHOUNG TECHNOLOGY CORPORATION, New Taipei (TW)

( * ) Notice: Subject to any disclaimer, the term of this patent is extended or adjusted under 35 U.S.C. 154(b) by 162 days.

(21) Appl. No.: 17/743,516

(22) Filed: May 13, 2022

(65) Prior Publication Data

US 2022/0373274 A1 Nov. 24, 2022

(30) Foreign Application Priority Data

May 19, 2021 (JP) ................................ 2021-084970

(51) Int. Cl.
| | |
|---|---|
| *F28F 3/04* | (2006.01) |
| *F28D 21/00* | (2006.01) |
| *F28F 13/14* | (2006.01) |
| *H01L 23/467* | (2006.01) |
| *H05K 7/20* | (2006.01) |

(52) U.S. Cl.
CPC ........ *F28F 3/04* (2013.01); *F28D 2021/0091* (2013.01); *F28F 13/14* (2013.01); *H01L 23/467* (2013.01); *H05K 7/20254* (2013.01); *H05K 7/20263* (2013.01); *H05K 7/20409* (2013.01)

(58) Field of Classification Search
CPC ... F28F 3/04; H05K 7/20254; H05K 7/20263; H05K 7/20409; H01L 23/467
See application file for complete search history.

(56) References Cited

U.S. PATENT DOCUMENTS

| | | | | |
|---|---|---|---|---|
| 6,031,720 A | * | 2/2000 | Crane, Jr. ............. | H01L 23/467 257/E23.099 |
| 2002/0139515 A1 | * | 10/2002 | Azar .................... | H01L 23/3672 257/E23.099 |
| 2007/0272392 A1 | * | 11/2007 | Ghosh ................. | H01L 23/4336 257/714 |

(Continued)

FOREIGN PATENT DOCUMENTS

| | | | | |
|---|---|---|---|---|
| CN | 106546116 A | | 3/2017 | |
| CN | 106612608 A | * | 5/2017 | ......... H05K 7/20136 |
| WO | WO-2012153414 A1 | * | 11/2012 | .............. B23P 15/26 |

*Primary Examiner* — Paul Alvare
(74) *Attorney, Agent, or Firm* — Keating & Bennett, LLP

(57) ABSTRACT

A heat dissipator includes a plate-shaped base portion that extends in a first direction along a direction where a refrigerant flows and in a second direction orthogonal to the first direction and has a thickness in a third direction, and fins that protrude from the base portion to one side in the third direction, extend in the first direction, are arranged in the second direction, and guide the refrigerant. A second of the fins is provided continuously on one side in the first direction that is a downstream side of a first of the fins, and a third fin that is provided continuously on another side in the first direction of the first fin, and includes an end on the one side in the third direction on the other side in the third direction.

7 Claims, 16 Drawing Sheets

(56) References Cited

U.S. PATENT DOCUMENTS

| | | | |
|---|---|---|---|
| 2010/0059213 A1* | 3/2010 | Liang | H05K 7/20409 165/185 |
| 2011/0286178 A1* | 11/2011 | Bridges | G06F 1/20 165/185 |
| 2012/0152498 A1* | 6/2012 | Lyon | H01L 23/473 165/104.19 |
| 2012/0175094 A1* | 7/2012 | Rice | F28F 3/12 165/170 |
| 2013/0240194 A1* | 9/2013 | Chen | F28F 3/12 165/185 |
| 2013/0240195 A1* | 9/2013 | Chen | B21C 23/06 165/185 |
| 2014/0311725 A1* | 10/2014 | Balasubramanian | H01L 23/473 165/168 |
| 2020/0214172 A1* | 7/2020 | Chen | H05K 7/20272 |
| 2022/0042751 A1* | 2/2022 | Smith | H01L 23/3675 |

* cited by examiner

HEAT DISSIPATION MEMBER INCLUDING FIN GROUPS

CROSS-REFERENCE TO RELATED APPLICATIONS

The present application claims priority under 35 U.S.C. § 119 to Japanese Patent Application No. 2021-084970, filed on May 19, 2021, the entire contents of which are hereby incorporated herein by reference.

1. Field of the Invention

The present disclosure relates to a heat dissipator.

2. Background

Conventionally, a heat dissipator is used for cooling a heating element. The heat dissipator includes a base part and a plurality of fins. The plurality of fins protrude from the base part. When a refrigerant such as water flows between adjacent fins in the plurality of fins, heat of the heating element moves to the refrigerant.

However, the conventional heat dissipator has room for improvement in cooling performance.

SUMMARY

An example embodiment of a heat dissipator of the present disclosure includes a plate-shaped base portion that extends in a first direction along a direction where a refrigerant flows and in a second direction orthogonal to the first direction and has a thickness in a third direction orthogonal to the first direction and the second direction, and fins that protrude from the base portion to one side in the third direction, extend in the first direction, are arranged in the second direction, and guide the refrigerant along a surface intersecting the second direction. A second of the fins is provided continuously on one side in the first direction that is a downstream side of a first of the fins, and includes an end on the one side in the third direction on another side in the third direction relative to an end on the one side in the third direction of a flow path between the first fin and a fin adjacent to the first fin in the second direction, and a third fin that is provided continuously on another side in the first direction of the first fin, and includes an end on the one side in the third direction on the other side in the third direction relative to the end on the one side in the third direction of the flow path.

The above and other elements, features, steps, characteristics and advantages of the present disclosure will become more apparent from the following detailed description of the example embodiments with reference to the attached drawings.

DETAILED DESCRIPTION

Figure 1:
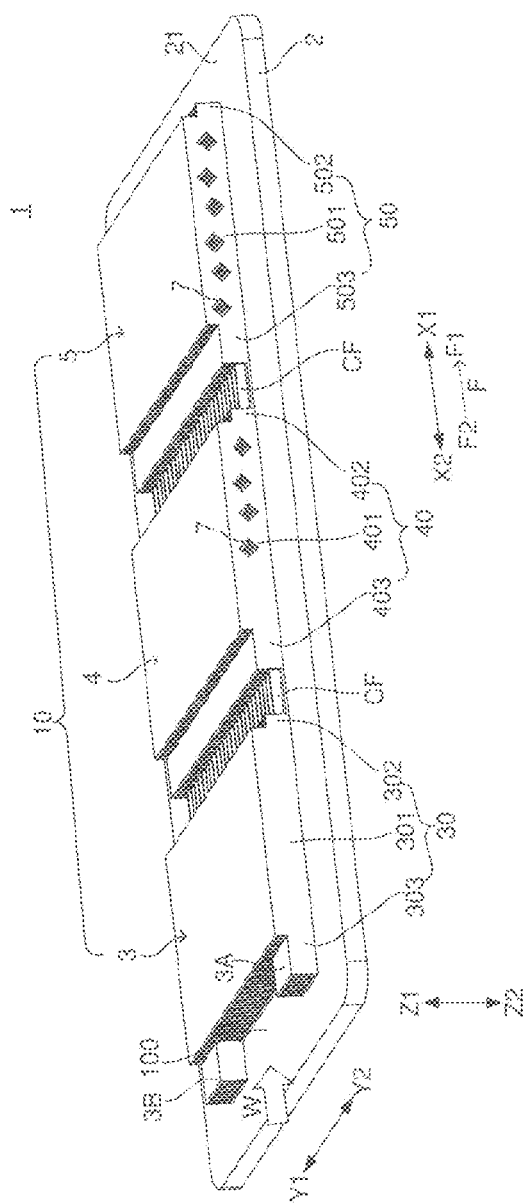
FIG. 1 is a perspective view of a heat dissipator according to an example embodiment of the present disclosure.

Hereinafter, example embodiments of the present disclosure will be described with reference to the drawings.

In the drawings, with the first direction as an X direction, X1 indicates one side in the first direction, and X2 indicates the other side in the first direction. The first direction is along a direction F in which a refrigerant W flows, and the downstream side is indicated by F1 and the upstream side is indicated by F2. With the second direction orthogonal to the first direction as a Y direction, Y1 indicates one side in the second direction, and Y2 indicates the other side in the second direction. With the third direction orthogonal to the first direction and the second direction as a Z direction, Z1 indicates one side in the third direction, and Z2 indicates the other side in the third direction. Note that the above-described "orthogonal" also includes intersection at an angle slightly shifted from 90 degrees. Each of the above-described directions does not limit a direction when a heat dissipator 1 is incorporated in various devices.

Figure 2:
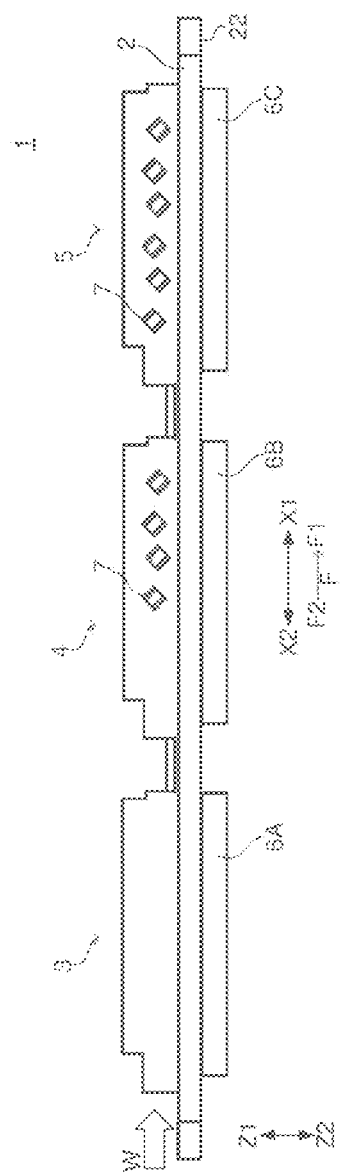
FIG. 2 is a side view of the heat dissipator as viewed to one side in the second direction.
Figure 3:
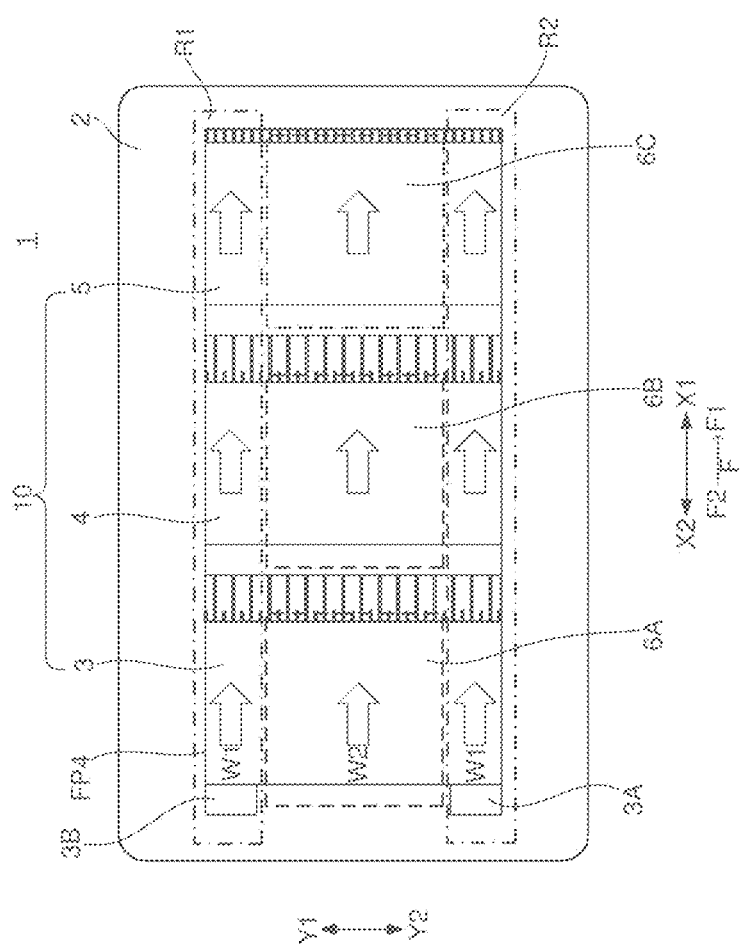
FIG. 3 is a plan view of the heat dissipator as viewed from one side in the third direction.

FIG. 1 is a perspective view of the heat dissipator 1 according to an example embodiment of the present disclosure. FIG. 2 is a side view of the heat dissipator 1 as viewed to one side in the second direction. FIG. 3 is a plan view of the heat dissipator 1 as viewed from one side in the third direction.

The heat dissipator 1 is a device that cools a plurality of heating elements 6A, 6B, and 6C (FIGS. 2 and 3) arranged in the first direction. The heating elements 6A, 6B, and 6C are power transistors of an inverter included in a traction motor for driving wheels of a vehicle, for example. The power transistor is, for example, an insulated gate bipolar transistor (IGBT). In this case, the heat dissipator 1 is mounted on a traction motor. The number of heating elements may be plural other than three.

The heat dissipator 1 includes a base portion 2 and a heat dissipation fin part 10. The heat dissipation fin part 10 includes an upstream side fin group 3, a center fin group 4, and a downstream side fin group 5.

The base portion 2 has a plate shape that extends in the first direction and the second direction and has a thickness in the third direction. The base portion 2 is made of a metal having high thermal conductivity, for example, a copper plate.

The upstream side fin group 3, the center fin group 4, and the downstream side fin group 5 are arranged on one side in the third direction of the base portion 2 from the other side in the first direction (upstream side) in toward one side in the first direction (downstream side) in this order. As described later, the fin groups 3, 4, and 5 are fixed to a surface 21 on one side in the third direction of the base portion 2 by brazing, for example.

The heating elements 6A, 6B, and 6C are in direct or indirect contact with a surface 22 on the other side in the third direction of the base portion 2 (FIG. 2). When viewed in the third direction, the heating elements 6A, 6B, and 6C overlap the fin groups 3, 4, and 5, respectively (FIG. 3).

When the refrigerant W is supplied to the upstream side fin group 3 from the upstream side relative to the upstream side fin group 3, the refrigerant W sequentially flows through the fin groups 3, 4, and 5 and is discharged from the downstream side fin group 5 to the downstream side. At this time, the heats generated from the heating elements 6A, 6B, and 6C move to the refrigerant W via the base portion 2 and the fin groups 3, 4, and 5, respectively. This cools the heating elements 6A, 6B, and 6C.

Figure 4:
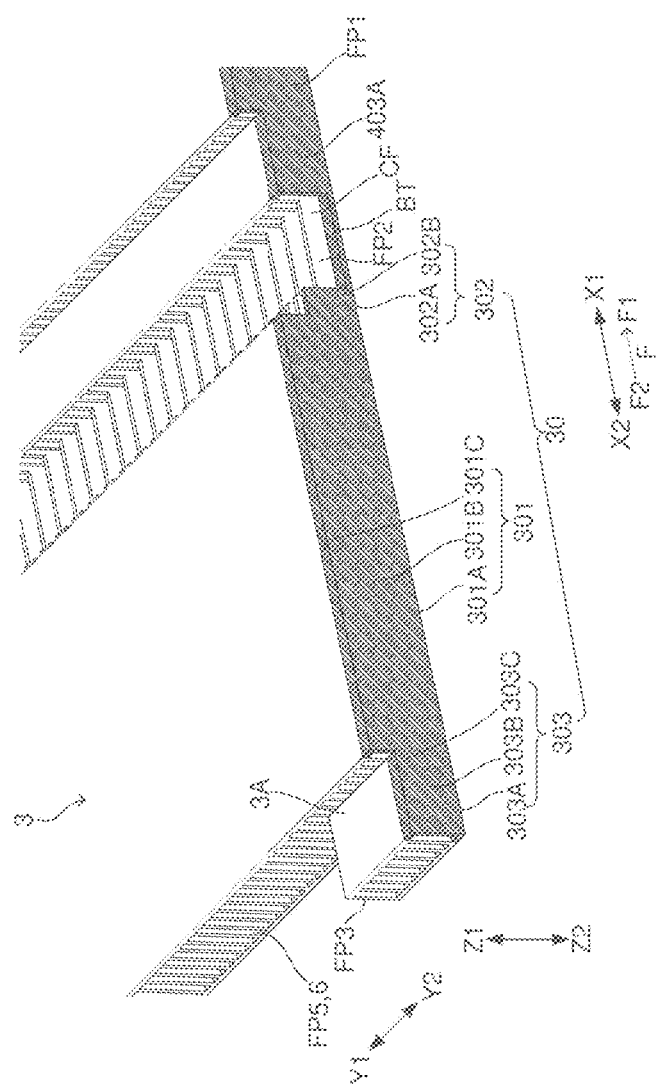
FIG. 4 is a partially enlarged view of an upstream side fin group in the heat dissipator.

Here, an example of a specific method of forming the heat dissipation fin part 10 (fin groups 3, 4, and 5) will be described also with reference to FIG. 4. FIG. 4 is a partially enlarged view of the upstream side fin group 3 in the heat dissipator 1.

The fin groups 3, 4, and 5 are configured as so-called stacked fins by arranging a plurality of fin plates FP in the second direction. The fin plate FP is formed of a metal plate extending in the first direction, and is formed of, for example, a copper plate. Each of the fin plates FP1 to FP6 illustrated in the drawing is a type of fin plate FP. That is, FP is used as an overall reference sign of the fin plate.

In order to understand the fin plate FP, FIG. 4 indicates, by hatching, the fin plate FP positioned on the most other side in the second direction. The fin plate FP includes fins 30, 40, and 50. Note that the fins 40 and 50 are shown in FIG. 1. The fins 30, 40, and 50 constitute the fin groups 3, 4, and 5, respectively.

As shown in FIG. 4, the fin 30 has a first fin 301, a second fin 302, and a third fin 303.

The first fin 301 has a bottom plate part 301A, a wall part 301B, and a top plate part 301C. The wall part 301B has a plate shape extending in the first direction and the third direction with the second direction as the thickness direction. The bottom plate part 301A is formed by being bent from an end portion on the other side in the third direction of the wall part 301B to one side in the second direction. The top plate part 301C is formed by being bent from an end portion on one side in the third direction of the wall part 301B to one side in the second direction. The bottom plate part 301A and the top plate part 301C oppose each other in the third direction. Due to this, the first fin 301 has a U-shaped cross section in a cut surface orthogonal to the first direction.

The bottom plate part 301A and bottom plate parts 302A and 303A described later are a part of a bottom plate part BT extending over the entire length in the first direction of the fin plate FP.

The second fin 302 is provided continuously on one side in the first direction of the first fin 301, and has the bottom plate part 302A and a wall part 302B. The wall part 302B has a plate shape extending in the first direction and the third direction with the second direction as the thickness direction. The wall part 302B is provided continuously on one side in the first direction of the wall part 301B. The position of the wall part 302B on an end surface on one side in the third direction is on the other side in the third direction relative to the position of an end surface on one side in the third direction of the wall part 301B.

The bottom plate part 302A is formed by being bent from the end portion on the other side in the third direction of the wall part 302B to one side in the second direction. Due to this, the second fin 302 has an L-shaped cross section in a cut surface orthogonal to the first direction. The function and the like of the second fin 302 will be described later.

The third fin 303 is provided continuously on the other side in the first direction of the first fin 301, and has the bottom plate part 303A, a wall part 303B, and a top plate part 303C. The wall part 303B has a plate shape extending in the first direction and the third direction with the second direction as the thickness direction. The wall part 303B is provided continuously on the other side in the first direction of the wall part 301B.

The bottom plate part 303A is formed by being bent from the end portion on the other side in the third direction of the wall part 303B to one side in the second direction. The top plate part 303C is formed by being bent from an end portion on one side in the third direction of the wall part 303B to one side in the second direction. The bottom plate part 303A and the top plate part 303C oppose each other in the third direction. Due to this, the third fin 303 has a U-shaped cross section in a cut surface orthogonal to the first direction. The position of the top plate part 303C on an end surface on one side in the third direction is on the other side in the third direction relative to the position of the end surface on one side in the third direction of the wall part 301B. The function and the like of the third fin 303 will be described later.

The fin 40 has a first fin 401, a second fin 402, and a third fin 403, and is configured similarly to the fin 30 (FIG. 1). The fin 50 has a first fin 501, a second fin 502, and a third fin 503, and is configured similarly to the fin 30 (FIG. 1).

Note that the fin plate FP (FP1) hatched in FIG. 4 has only a part of the bottom plate part BT between the fins 30 and 40 and between the fins 40 and 50. As shown in FIG. 4, some fin plates FP have not only a part of the bottom plate part BT but also a coupling fin CF between the fins 30 and 40 and between the fins 40 and 50 (fin plate FP2). The coupling fin CF couples, in the first direction, a wall part (e.g., 302A) on the other side in the first direction and a wall part (e.g., 403A (FIG. 4)) on one side in the first direction.

In an end region R2 on the other side in the second direction (FIG. 3) in the heat dissipation fin part 10, the fin plate FP (first type fin plate FP1) not having the coupling fin CF as described above and the fin plate FP (second type fin plate FP2) having the coupling fin CF are alternately arranged in the second direction. As shown in FIG. 4, the fin plate FP (third type fin plate FP3) in which the third fin 303 has only the wall part 303B is arranged at an end portion on one side in the second direction in the end region R2 on the other side in the second direction. In the end region R2 on the other side in the second direction, the fin plates FP1, FP2, and FP3 are arranged in the second direction, whereby a plurality of the third fins 303 are arranged in the second direction at an end portion on the other side in the first direction in the end region R2 on the other side in the second direction. Due to this, an end portion fin group 3A is formed (FIG. 4).

In an end region R1 on one side in the second direction (FIG. 3) of the heat dissipation fin part 10, the fin plates FP1 and FP2 are alternately arranged in the second direction. At an end portion on one side in the second direction in the end region R1 on one side in the second direction, a fin plate FP4 (fourth type fin plate) having a flat plate shape extending in the first direction and the third direction with the second direction as the thickness direction is arranged (FIG. 3).

In the end region R1 on one side in the second direction, the fin plates FP1, FP2, and FP4 are arranged in the second direction, whereby the plurality of third fins 303 are arranged in the second direction at the end portion on the other side in the first direction in the end region R1 on one side in the second direction. Due to this, an end portion fin group 3B is formed (FIG. 1).

In a region between the end region R1 on one side in the second direction and the end region R2 on the other side in the second direction, fin plates FP5 and FP6 (fifth and sixth type fin plates) not having the third fin 303 on the other side in the first direction in the fin plates FP1 and FP2 are alternately arranged in the second direction (FIG. 4). Due to this, a recess portion 100 recessed to the other side in the third direction is formed between the end portion fin groups 3A and 3B (FIG. 1).

In this manner, the heat dissipation fin part 10 (fin groups 3, 4, and 5) is formed with various fin plates FP arranged in the second direction and integrated by, for example, caulking or the like. The formed heat dissipation fin part 10 is fixed to the surface 21 on one side in the third direction of the base portion 2 by brazing, for example. In this manner, by configuring the heat dissipation fin part 10 using the fin plate FP having a configuration in which the fins 30, 40, and 50 are integrated in the first direction, it is possible to increase the rigidity of the heat dissipator 1 and suppress deflection and the like due to flow of the refrigerant W even when the thickness of the base portion 2 is reduced for thermal conductivity.

With such a configuration, in the fin groups 3, 4, and 5, the refrigerant W flows through a flow path formed by the fins 30, 40, and 50 adjacent in the second direction. At this time, the refrigerant W flows on the bottom plate part BT. When the fin plate FP is not provided with the bottom plate part BT, the refrigerant W flows on the base portion 2. For example, in the case of the fin 30, the refrigerant W is guided along wall surfaces (surfaces orthogonal to the second direction) of the wall parts 303B, 301B, and 302B.

That is, the heat dissipator 1 includes the plurality of fins 30, 40, and 50 that protrude from the base portion 2 to one side in the third direction, extend in the first direction, are arranged in the second direction, and guide the refrigerant W along a surface intersecting the second direction.

The heat dissipator 1 has the plurality of fin groups 3, 4, and 5 that are configured by arranging, in the second direction, the plurality of fins 30, 40, and 50 that protrude from the base portion 2 to one side in the third direction and extend in the first direction, the plurality of fin groups 3, 4, and 5 being arranged side by side in the first direction.

Next, in the fins 30 and 40, the second fins 302 and 402 arranged on the downstream side will be described more specifically. Here, the second fin 302 will be described as an example with reference to FIGS. 5 and 6, but the content of the second fin 402 is similar.

Figure 5:
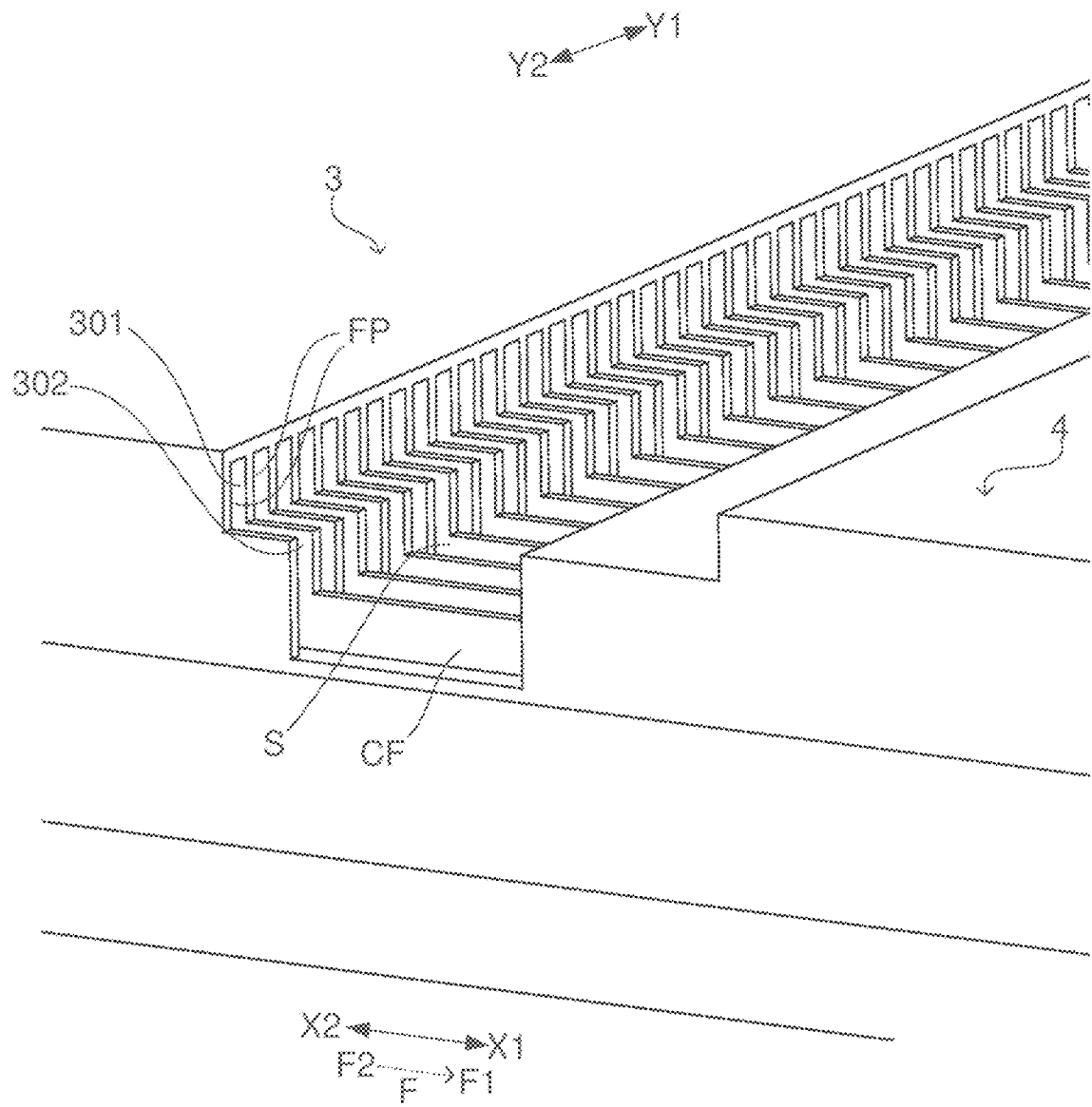
FIG. 5 is a partially enlarged view showing a configuration in the vicinity between the upstream side fin group and a center fin group.

FIG. 5 is a partially enlarged view showing the configuration in the vicinity between the upstream side fin group 3 and the center fin group 4. As shown in FIG. 5, a plurality of the second fins 302 are arranged in the second direction. The position of the second fin 302 at the end on one side in the third direction is positioned on the other side in the third direction relative to the end on one side in the third direction of the flow path FP formed between the first fin 301 and the fin 30 adjacent to the first fin 301 in the second direction.

Figure 6:
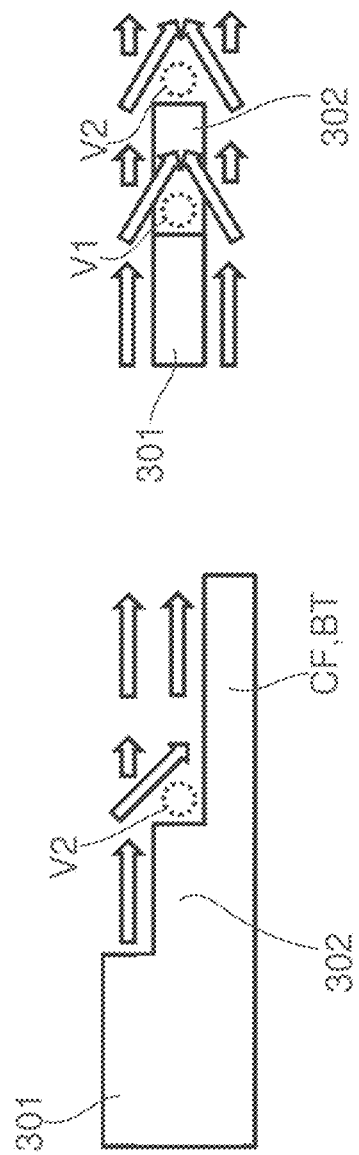
FIG. 6 is a view schematically showing a flow of a refrigerant in the vicinity of a second fin according to an example embodiment of the present disclosure.

Here, FIG. 6 is a view schematically showing the flow of the refrigerant W in the vicinity of the second fin 302. The left side of FIG. 6 is a side view as viewed in the second direction, and the right side of FIG. 6 is a plan view as viewed in the third direction. The refrigerant W having flowed through the flow path FP in this manner can flow into a part of the second fin 302 on one side in the third direction, whereby a vortex V1 is generated at a boundary between the first fin 301 and the second fin 302. Therefore, mixing of the refrigerant W in the vicinity of the second fin 302 on one side in the third direction is facilitated.

Here, as shown in FIG. 3, since both ends in the second direction of the heating element 6A are arranged close to the center side in the second direction, heat transfer to the refrigerant W1 flowing through both end portions in the second direction of the fin group 3 is small, and the temperature of the refrigerant W1 is relatively low. On the other hand, heat transfer to a refrigerant W2 flowing on the center side in the second direction of the fin group 3 becomes large, and the temperature of the refrigerant W2 is relatively high. However, as described above, mixing of the refrigerants W1 and W2 is facilitated at a downstream side outlet of the fin group 3. This facilitates homogenization of the temperature of the refrigerant W, and can improve the cooling performance in the fin group 4 on a subsequent stage side.

As shown in FIG. 5, the coupling fin CF is formed between the second fin 302 and the fin 40 in the fin group 4 on the subsequent stage side, and a space is formed on one side in the third direction of the coupling fin CF. Alternatively, a space is formed between the second fin 302 and the fin 40 on the subsequent stage side without forming the coupling fin CF. A slot S is formed by the space formed as described above. The slot S has an effect of stopping the growth of a boundary layer in the fin to improve the cooling performance, an effect of mixing the refrigerant W discharged from the downstream side outlet of the fin group 3, and an effect of reducing pressure loss. By providing the coupling fin CF, it is possible to improve rigidity of the heat dissipator 1, and increase a contact area with the refrigerant W in the slot S to improve the cooling performance.

As shown in FIG. 6, the refrigerant W flows from one side in the third direction of the second fin 302 toward the coupling fin CF or the bottom plate part BT, and the refrigerant W having flowed along the second fin 302 flows into one side in the third direction of the coupling fin CF or the bottom plate part BT, thereby generating a vortex V2. Such vortex V2 facilitates mixing of the refrigerant W in the slot S. Therefore, the temperature of the refrigerant W is homogenized more, and the cooling performance in the fin group 4 on a subsequent stage side can be improved.

Since a turbulence generation effect is enhanced by the second fins 302 as described above, when the refrigerant W flows into the fin group 4 on the subsequent stage side due to the influence of the turbulence, the growth of the boundary layer is suppressed, and the cooling performance can be improved.

Next, the third fins 303, 403, and 503 arranged on the upstream side in the fins 30, 40, and 50 will be described more specifically.

Figure 7:
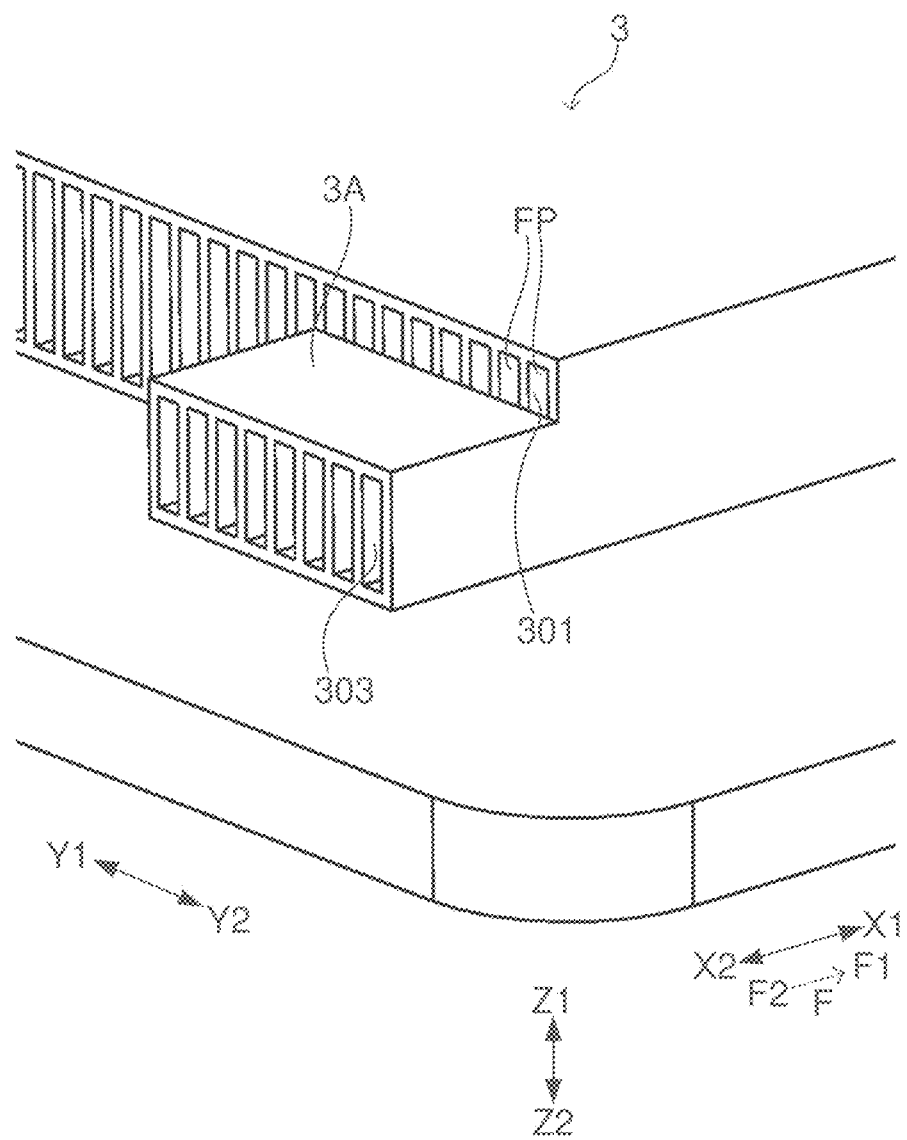
FIG. 7 is a partially enlarged view showing a configuration in the vicinity of an end portion fin group in the upstream side fin group.

FIG. 7 is a partially enlarged view showing the configuration in the vicinity of the end portion fin group 3A in the upstream side fin group 3. The position of the third fin 303 at the end on one side in the third direction is on the other side in the third direction relative to the position of the end on one side in the third direction of the flow path FP formed on both sides of the first fin 301 in the second direction.

Figure 8:
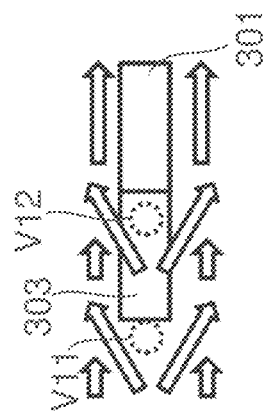
FIG. 8 is a view schematically showing a flow of the refrigerant in the vicinity of a third fin according to an example embodiment of the present disclosure.
Figure 8:
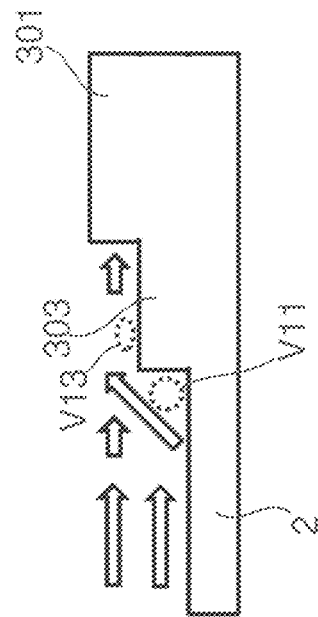

FIG. 8 is a view schematically showing a flow of the refrigerant W in the vicinity of the third fin 303. The left side of FIG. 8 is a side view as viewed in the second direction, and the right side of FIG. 8 is a plan view as viewed in the third direction. Thus, the refrigerant W having flowed on the base portion 2 flows into both sides of the third fin 303 in the second direction, whereby a vortex V11 is generated in the vicinity of the end on the other side in the first direction of the third fin 303. The refrigerant W having flowed on the third fin 303 flows into both sides of the first fin 301 in the second direction, whereby a vortex V12 is generated in the vicinity of the end on the other side in the first direction of the first fin 301. Since the refrigerant W having flowed on the base portion 2 flows into the end portion of the third fin 303 on the other side in the first direction on one side in the third direction, a vortex V13 is generated.

Thus, since by providing the third fin 303, the turbulence generation effect is enhanced, the rectification of the refrigerant W having flowed into the fin group 3 is delayed, and the growth of the boundary layer is suppressed, the cooling performance can be improved. The turbulence generation effect by the third fin 303 is higher than the effect by the second fin 302.

Figure 9:
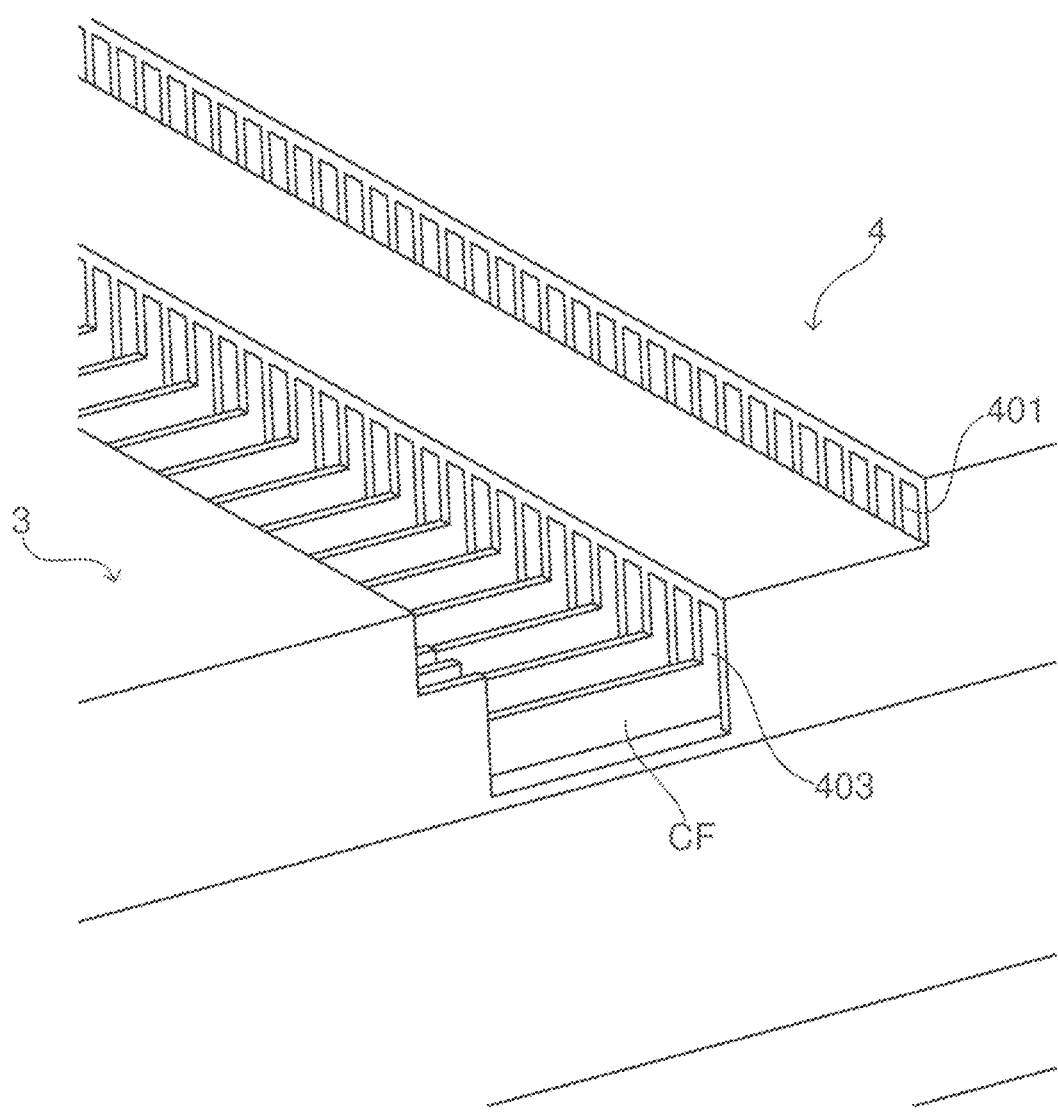
FIG. 9 is a partially enlarged view showing a configuration in the vicinity between the upstream side fin group and the center fin group.

FIG. 9 is a partially enlarged view showing the configuration in the vicinity between the upstream side fin group 3 and the center fin group 4. By providing the third fin 403 in the fin group 4 shown in FIG. 9, similarly to the above effect, the vortex V11 is generated at the boundary between the coupling fin CF or the bottom plate part BT and the third fin 403, and the vortices V12 and V13 are generated on one side in the third direction of the third fin 403. This enhances the turbulence generation effect, and improves the cooling performance by the refrigerant W having flowed into the fin group 4. Note that the third fin 503 in the fin 50 has the same effect.

Note that any of the fins 30, 40, and 50 does not need to have both the second fin and the third fin. Any of the fins 30, 40, and 50 may have only one of the second fin and the third fin.

That is, in the present example embodiment, at least any of the fins 30 has the first fin 301. The at least any fin 30 includes the second fin 302 that is provided continuously on one side in the first direction of the first fin 301, and has an end on one side in the third direction on the other side in the third direction relative to an end on one side in the third direction of the flow path FP formed between the first fin 301 and the fin 30 adjacent to the first fin 301 in the second direction, and the third fin 303 that is provided continuously on the other side in the first direction of the first fin 301, and has an end on one side in the third direction on the other side in the third direction relative to the end on one side in the third direction of the flow path FP.

The at least any of the fins 30 has the second fin 302. An interval in the first direction is formed between the second fin 302 and a subsequent stage fin 40 arranged on one side in the first direction of the second fin 302.

The heat dissipator 1 has the coupling fin CF that couples, in the first direction, at least any of the second fins 302 and the subsequent stage fin 40.

Figure 10:
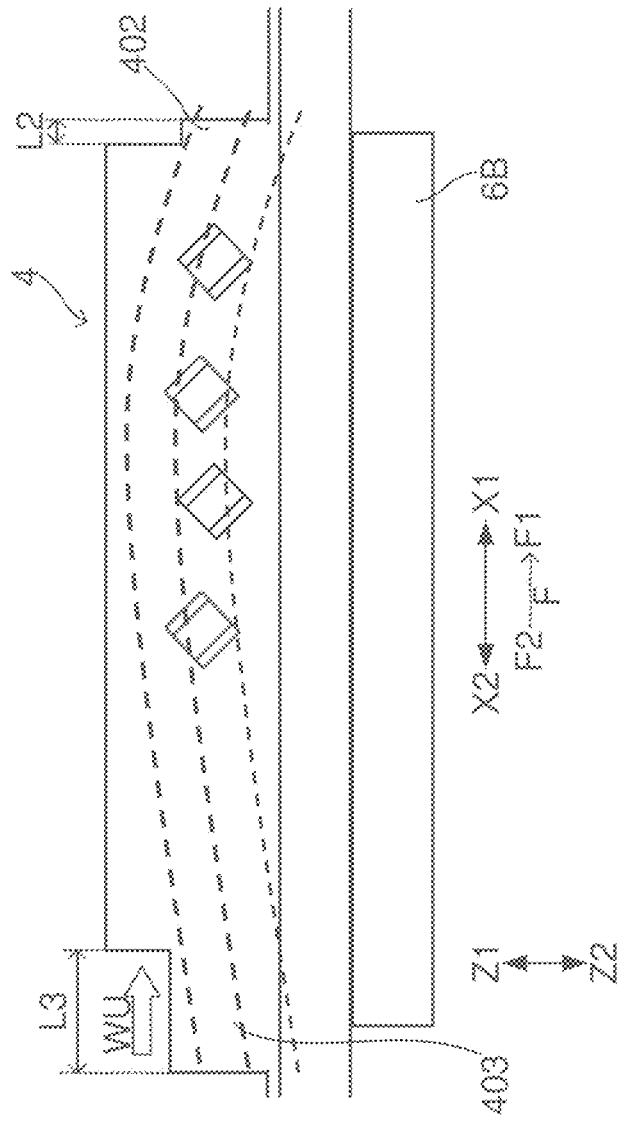
FIG. 10 is a side view of the center fin group.

Here, FIG. 10 is a side view of the center fin group 4. As shown in FIG. 10, a first direction length L3 of the third fin 403 is longer than a first direction length L2 of the second fin 402. Since a refrigerant WU not subjected to heat exchange flows into the flow path formed by the fin 40 from one side in the third direction of the third fins 403, as indicated by an isotherm indicated by the broken line in FIG. 10, there is an effect of putting the peak of reduction in cooling performance on the downstream side of the center in the first direction of the fin 40. Therefore, it is possible to improve the cooling performance on the downstream side of the heating element 6B. Note that the effect by this configuration is the same for the downstream side fin group 5.

As described above, in the heat dissipation fin part 10, the end portion fin groups 3A and 3B are configured. On the downstream side of the downstream side fin group 5, the second fin 502 may constitute an end portion fin group in both end portions in the second direction.

That is, the heat dissipator 1 has an end portion fin group formed by the plurality of second fins 502 or third fins 303 adjacent to in the second direction and arranged in both end portions in the second direction in the fin groups 5 and 3 including the plurality of fins 50 and 30. The recess portion 100 recessed to the other side in the third direction is formed between the end portion fin groups. This allow the operator can suppress an error in the attaching direction when attaching the heat dissipator 1 by checking the recess portion 100.

Note that the end portion fin group is more desirably configured in the upstream side fin group 3. That is, the end portion fin groups 3A and 3B include the third fin 303, and the fin group 3 is arranged on the most other side in the first direction among the plurality of fin groups 3, 4, and 5 arranged in the first direction. Thus, by providing the recess portion 100 on the upstream side, flow path resistance on the center side in the second direction when the refrigerant W flows into the fin group 3 can be reduced, and the cooling performance of the heating element 6A positioned on center side in the second direction in the fin group 3 can be improved.

In other words, the end portion fin groups 3A and 3B arranged at both end portions in the second direction are provided at the end portion on the other side in the first direction of the fin group 3 arranged on the most other side in the first direction or at the end portion on one side in the first direction of the fin group 5 arranged on the most one side in the first direction, and the recess portion 100 recessed to the other side in the third direction is formed between the end portion fin groups 3A and 3B.

Then, the end portion fin groups 3A and 3B are desirably included in the fin group 3 arranged on the most other side in the first direction.

As shown in FIGS. 1 and 2, in the center fin group 4 and the downstream side fin group 5, spoilers 7 are formed in the fin 40 and 50.

Figure 11:
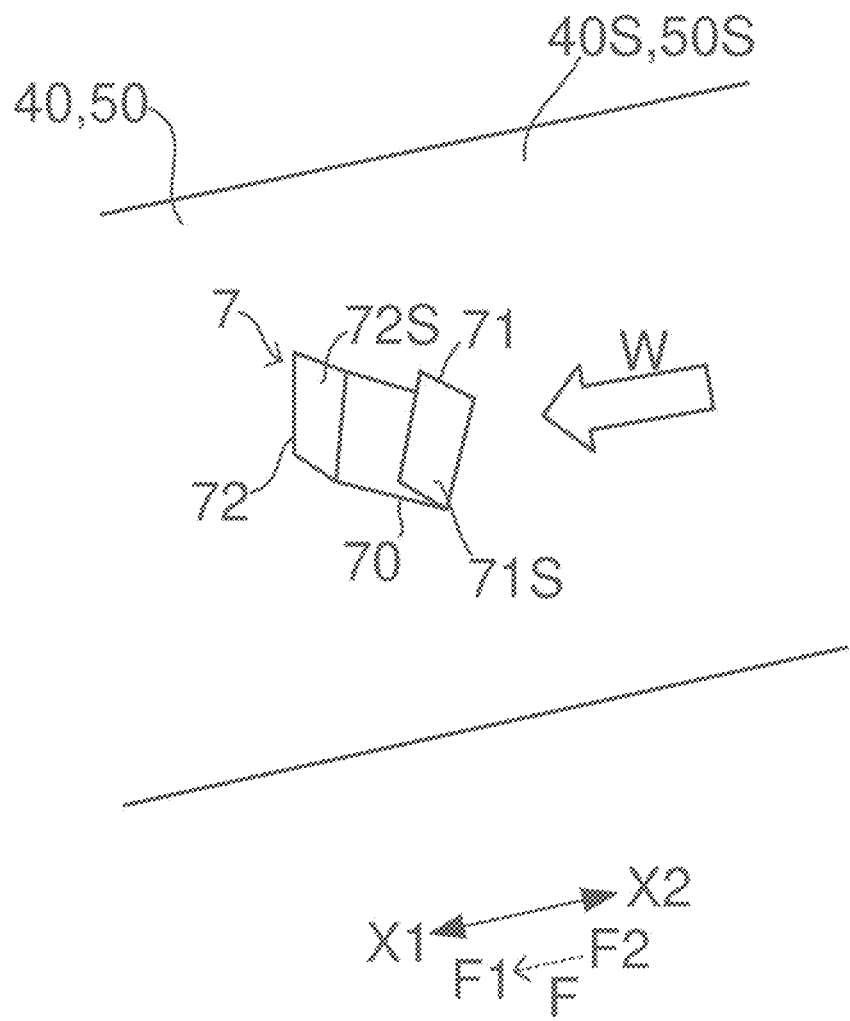
FIG. 11 is a perspective view showing a configuration example of a spoiler according to an example embodiment of the present disclosure.

Here, FIG. 11 shows a perspective view showing a configuration example of the spoiler 7. The fins 40 and 50 have guide surfaces 40S and 50S that extend in the first direction and guide the refrigerant W. The spoiler 7 has an opening 70 penetrating the fins 40 and 50 in the second direction. The spoiler 7 has protrusions 71 and 72. The protrusions 71 and 72 are formed by being bent to one side in the same second direction at the edge of the opening 70, and oppose each other in the first direction. The opening 70 and the protrusions 71 and 72 can be formed by cutting and bending the fins 40 and 50. The protrusion 71 is arranged on the other side in the first direction relative to the protrusion 72.

The protrusions 71 and 72 have opposing surfaces 71S and 72S opposing each other in the direction where the refrigerant W flows, that is, one side in the first direction. The opposing surfaces 71S and 72S are included in the protrusions 71 and 72. The spoiler 7 has a function of preventing the flow of the refrigerant W by the opposing surfaces 71S and 72S. The turbulence of the refrigerant W is easily generated in the vicinity of the opposing surfaces 71S and 72S, and the cooling performance by the fins 40 and 50 can be improved.

The number of the protrusions is not limited to two, and may be one or three or more. That is, the spoiler 7 has at least one of the protrusion 71 or 72 protruding from the guide surfaces 40S and 50S in the second direction at the edge of the opening 70. The protrusions 71 and 72 can be easily formed as described above.

The at least one protrusion 71 or 72 is plural. Due to this, since the plurality of opposing surfaces 71S and 72S are provided, the number of places where the turbulence is generated can be increased, and the cooling performance can be further improved.

The protrusions 71 and 72 are inclined to one side in the first direction and the other side in the third direction. This makes it possible to guide the refrigerant W on the heating elements 6B and 6C side by the protrusions 71 and 72, and improve the cooling performance. Furthermore, two of the protrusions 71 and 72 are provided and protrude in the same direction. Due to this, the refrigerant W passes between the two protrusions 71 and 72 opposing each other, whereby the refrigerant W can be guided on the heating elements 6B and 6C side. The protrusions 71 and 72 may protrude in directions different from each other.

Figure 12:
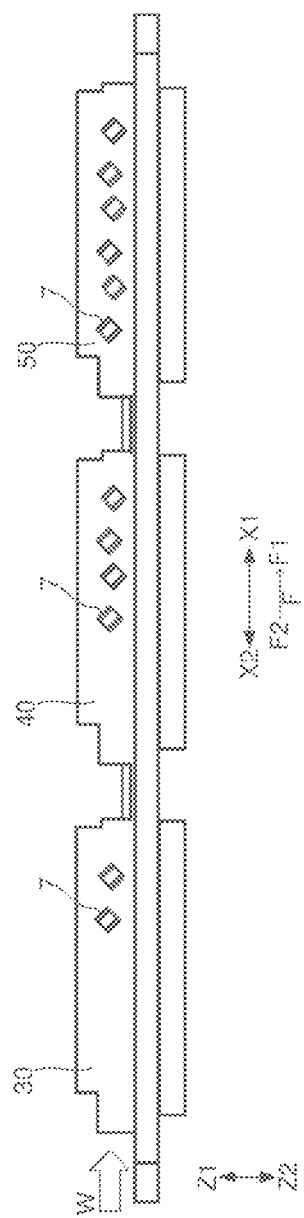
FIG. 12 is a side view showing a modification of the arrangement number of the spoilers.
Figure 13:
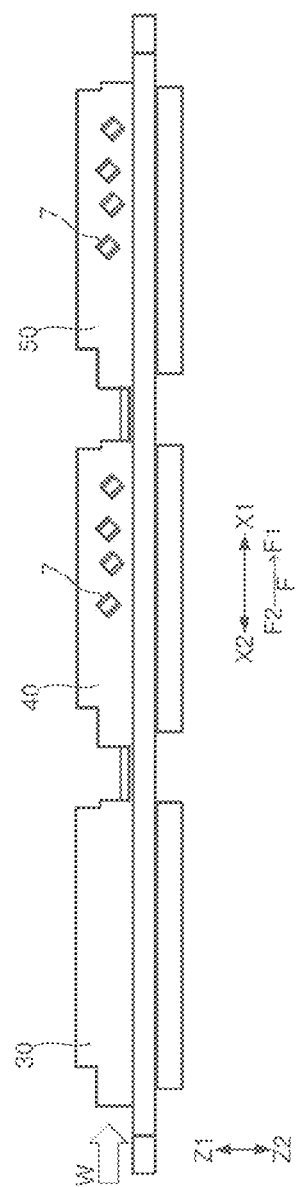
FIG. 13 is a side view showing a modification of the arrangement number of the spoilers.

In the fin groups 4 and 5, for example, the spoilers 7 are provided in the fins 40 and 50 other than the fins 40 and 50 positioned at end on one side in the second direction, respectively. That is, at least any of the fins 40 and 50 included in at least any of the fin groups 4 and 5 has the spoiler 7. As shown in FIG. 2, for example, in the fins 30, 40, and 50 at the same second direction position, the numbers of spoilers 7 are 0, 4, and 6. For example, as shown in FIG. 12, in the fins 30, 40, and 50 at the same second direction position, the numbers of spoilers 7 may be adjusted after the spoilers 7 are provided in the fins 30 such as the numbers of spoilers 7 being 2, 4, and 6. Furthermore, for example, as shown in FIG. 13, in the fins 30, 40, and 50 at the same second direction position, the numbers of spoilers 7 may be the same on the downstream side, such as 0, 4, and 4.

That is, the numbers of spoilers 7 included in the fins 30, 40, and 50, respectively, at the same second direction position in the plurality of fin groups 3, 4, and 5 increase toward one side in the first direction. When the heating element are arranged in the first direction as the heating elements 6A, 6B, and 6C, since the temperature of the refrigerant W increases toward the downstream side, it is necessary to improve cooling performance on the downstream side. Therefore, since the number of spoilers 7 increases toward the downstream side, it is possible to improve the cooling performance on the downstream side for which the cooling performance should be improved, and to suppress the temperature difference among the heating elements 6A, 6B, and 6C.

Figure 14:
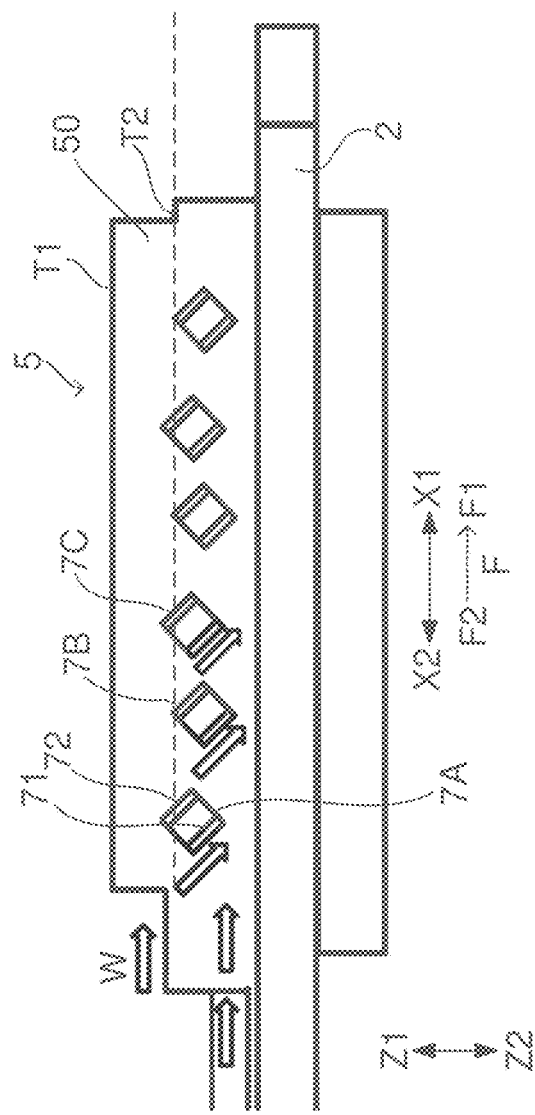
FIG. 14 is a side view of a downstream side fin group according to an example embodiment of the present disclosure.

As shown in FIG. 14, in at least any of the fin groups 5, at least a part of the protrusion 72 on one side in the third direction is arranged on one side in the third direction relative to a fin end T2 that is an end on one side in the third direction positioned on the other side in the third direction relative to an end T1 on one side in the third direction on the most one side in the third direction in the fin 50 as viewed in the second direction, and at least a part of the protrusion 71 on the other side in the third direction is arranged on the other side in the third direction relative to the fin end T2.

As shown in FIG. 14, the spoilers 7 are alternately positioned in the order of one side in the third direction and the other side in the third direction toward one side in the first direction.

A spoiler 7A (high-position spoiler) on one side in the third direction positioned on the most upstream side forcibly guides, on the base portion 2 side the refrigerant W far from the base portion 2 on one side in the third direction. A spoiler 7B (low-position spoiler) on the other side in the third direction guides the refrigerant W so as to collide with the surface on the base portion 2 side. A spoiler 7C on one side in the third direction other than the most upstream side returns, to the base portion 2 side again, the refrigerant W having collided and bounced back on the surface on the base portion 2 side.

Figure 15:
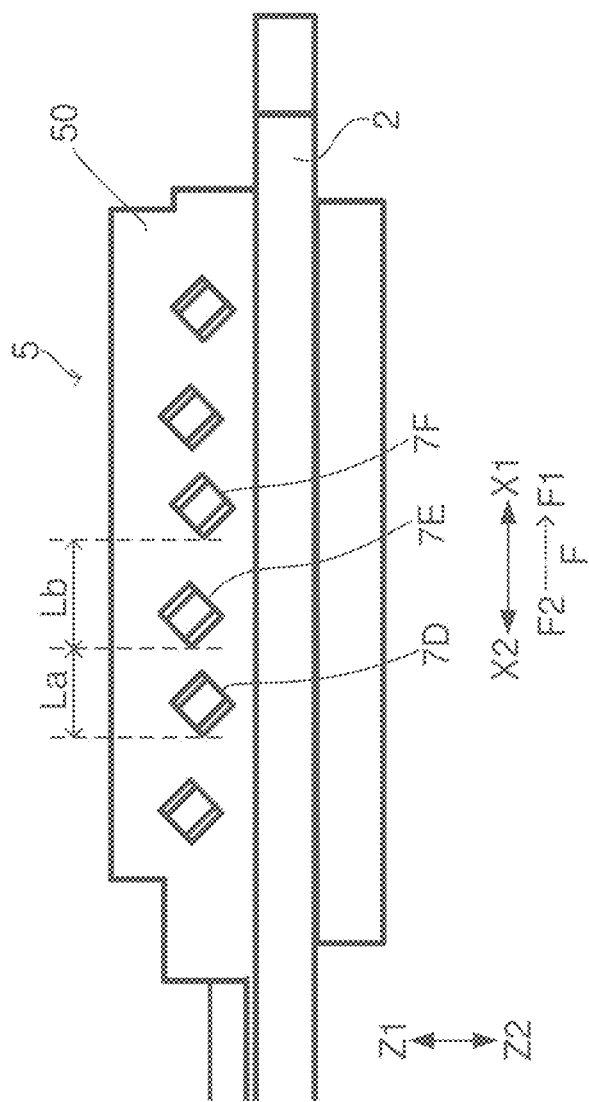
FIG. 15 is a side view of the downstream side fin group.

As shown in FIG. 15, in at least any of the fin groups 5, the spoilers 7 are alternately positioned in the third direction along the first direction, and a first direction interval La between spoilers 7D and 7E where the other side in the first direction is positioned on the other side in the third direction relative to one side in the first direction adjacent in the first direction is shorter than a first direction interval Lb between spoilers 7E and 7F where the other side in the first direction is positioned on one side in the third direction relative to one side in the first direction adjacent in the first direction.

Since the refrigerant W to be guided to the base portion 2 side by the spoiler 7D on the other side in the first direction vigorously bounces back on the surface on the base portion 2 side, the interval between the spoilers 7D and 7E needs to be shortened in order to guide the refrigerant W to the base portion 2 side again. Since the refrigerant W to be guided to the base portion 2 side by the spoiler 7E on one side in the first direction has less momentum when bouncing back than that of the refrigerant W to be guided to the base portion 2 side by the spoiler 7D on the other side in the first direction, the interval between the spoilers 7E and 7F may be long.

Figure 16:
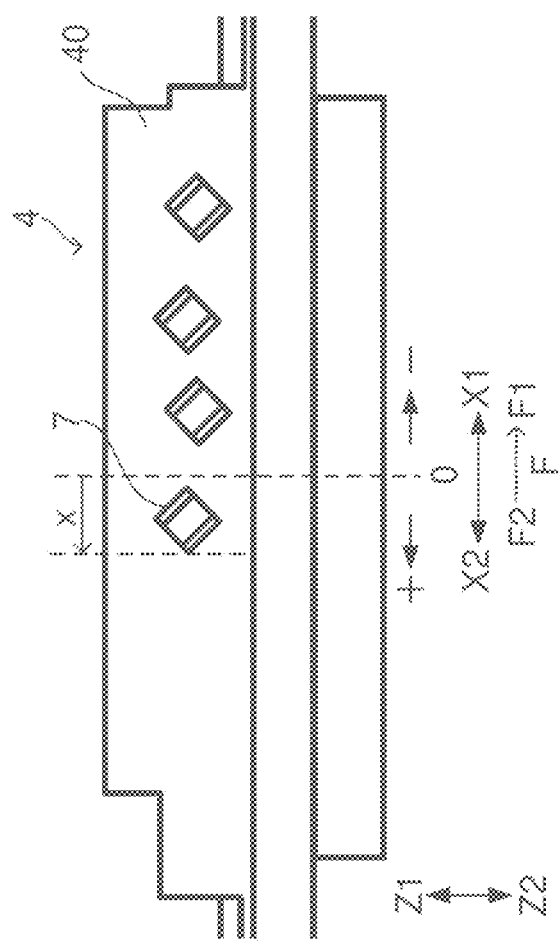
FIG. 16 is a side view of the center fin group.

As shown in FIG. 16, with the center position of the fin 40 in the first direction being reference=0, the upstream side is set to +, and the downstream side is set to −. When the center of gravity (average) of a position x of each spoiler 7 in the fin 40 with respect to the reference is taken, the center of gravity is on the downstream side (−).

That is, in at least any of the fin groups 4, the center of gravity of the position of the spoiler 7 with respect to the first direction center position of the fin 40 is positioned on one side in the first direction relative to the first direction center position. This makes it possible to improve the cooling performance of the part on the downstream side for which the cooling performance in the heating element 6B overlapping the fin group 4 as viewed in the third direction should be improved.

As shown in FIG. 2, the spoiler 7 is not provided in the fin group 3 on the most upstream side. That is, the spoiler 7 arranged on the most other side in the first direction in the plurality of fin groups 3, 4, and 5 is included in the fin group 4 arranged on one side in the first direction relative to the fin group 3 on the most other side in the first direction. This makes it possible not to provide the spoiler 7 in the fin group 3 on the most upstream side that does not relatively require improvement in cooling performance. This makes it possible to reduce the processing cost for forming the spoiler 7.

In other words, in the plurality of fin groups 3, 4, and 5 arranged in the first direction, the fin group 4 including the plurality of fins 40 is arranged on one side in the first direction relative to the fin group 3 on the most other side in the first direction, and the spoiler 7 on the most other side in the first direction is arranged on the most other side in the first direction among the spoilers 7 arranged in the first direction in the plurality of fin groups 3, 4, and 5.

The example embodiment of the present disclosure has been described above. Note that the scope of the present disclosure is not limited to the above example embodiment. The present disclosure can be implemented by making various modifications to the above-described example embodiment without departing from the gist of the disclosure. The matters described in the above example embodiment can be arbitrarily combined together, as appropriate, as long as there is no inconsistency.

For example, a vapor chamber or a heat pipe may be provided between the heating element and the heat dissipator.

The present disclosure can be used for cooling various heating elements.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A heat dissipator comprising:
    a plate-shaped base portion that extends in a first direction along a direction where a refrigerant flows and in a second direction orthogonal to the first direction and has a thickness in a third direction orthogonal to the first direction and the second direction; and
    fins that protrude from the base portion to one side in the third direction, extend in the first direction, are arranged in the second direction, and guide the refrigerant along a surface intersecting the second direction; wherein
    a second of the fins that is provided continuously on one side in the first direction that is a downstream side of a first of the fins, and includes an end on the one side in the third direction being different relative to an end on the one side in the third direction of a flow path provided between the first fin and a fin adjacent to the first fin in the second direction;
    a third of the fins that is provided continuously on another side in the first direction of the first fin, and includes an end on the one side in the third direction being different relative to the end on the one side in the third direction of the flow path;
    the heat dissipator further includes end portion fin groups defined by multiple adjacent ones of the second fin or the third fin in the second direction and arranged in two ends in the second direction in a fin group including the fins; and
    a recess portion recessed to another side in the third direction is provided between the end portion fin groups.

2. The heat dissipator according to claim 1, wherein an interval in the first direction is between the second fin and a subsequent stage fin on the one side in the first direction of the second fin.

3. The heat dissipator according to claim 2, further comprising a coupling fin that couples, in the first direction, at least one of the second fin and the subsequent stage fin.

4. The heat dissipator according to claim 1, wherein a first direction length of the third fin is longer than a first direction length of the second fin.

5. The heat dissipator according to claim 1, wherein
    the end portion fin groups includes the third fin; and
    one of the fin groups is arranged on a farthest other side in the first direction among fin groups arranged in the first direction.

6. The heat dissipator according to claim 1, wherein
    at least one of the fins includes a spoiler that includes a surface that at least partially faces the one side in the first direction; and
    a center of gravity of a position of the spoiler with respect to a first direction center position of the at least one of the fins is positioned on the one side in the first direction relative to the first direction center position.

7. The heat dissipator according to claim 1, wherein
    at least some of the fins include spoilers that include an opposing surface that opposes the one side in the first direction;
    a fin group including the fins is on the one side in the first direction relative to a fin group including the fins farthest on another side in the first direction in multiple fin groups arranged in the first direction; and
    the spoilers include a spoiler which is farthest on the other side in the first direction among the spoilers in the first direction in the fin groups.

\* \* \* \* \*